United States Patent [19]

Freundlich et al.

[11] Patent Number: 5,407,491

[45] Date of Patent: Apr. 18, 1995

[54] TANDEM SOLAR CELL WITH IMPROVED TUNNEL JUNCTION

[75] Inventors: Alexandre Freundlich; Mauro F. Vilela; Abdelhak Bensaoula; Alex Ignatiev, all of Houston, Tex.

[73] Assignee: University of Houston, Houston, Tex.

[21] Appl. No.: 44,941

[22] Filed: Apr. 8, 1993

[51] Int. Cl.$^6$ ............ H01L 31/06; H01L 31/18; H01L 31/0304
[52] U.S. Cl. .................. 136/249; 136/252; 136/262; 437/5; 437/107; 257/104; 257/615
[58] Field of Search ........... 136/249 TJ, 252, 262; 437/5, 107; 257/104, 615

[56] References Cited

U.S. PATENT DOCUMENTS

| | | | |
|---|---|---|---|
| 4,278,473 | 7/1981 | Borden | 136/249 MS |
| 4,278,474 | 7/1981 | Blakeslee | 136/249 TJ |
| 5,008,718 | 4/1991 | Fletcher | 257/96 |
| 5,009,719 | 4/1991 | Yoshida | 136/249 TJ |
| 5,019,177 | 5/1991 | Wanlass | 136/249 TJ |

OTHER PUBLICATIONS

M. W. Wanlass, *Proceedings, 22nd IEEE Photovoltaic Specialists Conf.* (Oct. 1991), pp. 38–42.

Shen, C. C., P. T. Chang and K. Y. Choi, "An In$_{0.53}$Ga$_{0.47}$As Tunnel Diode for Monolithic Multijunction Solar Cell Application," 1988 IEEE, pp. 771–776.

Shen, C. C. and P. T. Chang, "Two-Terminal Monolithic InP/InGaAsP Tantem Solar Cells with Tunneling Intercell Ohmic Connections," 1991 IEEE, pp. 381–387.

Nordwall, Bruce D., "Satellite to Probe Solar Cell Damage From Space Plasma and Radiation," *Aviation Week & Space Technology*, Feb. 17, 1992.

Zorpette, Glenn, "Photovoltaics: technical gains and an uncertain market," *IEEE Spectrum*, Jul. 1989, pp. 42–43.

Yates, Marshall, "House Approves Energy Spending Bill," *Public Utilities Fortnightly*, Jul. 19, 1990, pp. 40–41.

"USAF Funding R&D to Design More Efficient Solar Cells," *Aviation Week & Space Technology*, Apr. 10, 1989, pp. 81, 85.

Miller, William H., "Back Into the Sunshine," *Industry Week*, Feb. 4, 1991, pp. 52–56.

Greenberger, Leonard S., "SCE Reveals Promising Solar Technology," *Public Utilities Fortnightly*, May 15 per a.m.k. (year not known).

Tyner, John T., "Desert Tortoises Drive 220-kV Line Construction Skyward," *Transmission & Distribution*, Sep. 1991, pp. 28–30.

Annan, Robert H., "Photovoltaic solar approaches role as peaking power producer," *Power Engineering*, Apr. 1989.

Rosen, Jerome, "Solar Furnaces: Concentrating 100,000 Suns," *Mechanical Engineering*, Feb. 1991, pp. 42–46.

Ashley, Steven, "Solar Photovoltaics: Out of the Lab and onto the Production Line," *Mechanical Engineering*, Jan. 1992.

*Primary Examiner*—Aaron Weisstuch
*Attorney, Agent, or Firm*—Pravel, Hewitt, Kimball & Krieger

[57] ABSTRACT

A monolithic, tandem photovoltaic device is provided having an indium gallium arsenide tunnel junction lattice-matched to adjoining subcells and having high peak current densities and low electrical resistance. A method is provided for relatively low-temperature epitaxial growth of a subcell over the tunnel junction at temperatures which leave intact the desirable characteristics of the tunnel junction.

28 Claims, 7 Drawing Sheets

TANDEM SOLAR CELL WITH IMPROVED TUNNEL JUNCTION

FIELD OF THE INVENTION

This invention provides an improved tandem solar cell and method of fabrication. More particularly, a two-terminal multi-cell monolithic photovoltaic device is provided by formation of a tunnel junction between tandem subcells, the subcell grown on the tunnel junction being formed at a relatively low temperature.

BACKGROUND OF THE INVENTION

Efforts to improve the efficiency of photovoltaic devices, which are used to convert solar energy to electrical energy, are widely supported. The cost of producing electrical power from solar energy has continued to decline in recent years as a result of these efforts and the market for solar cells has increased as the cost of producing electrical power has declined. Most of the solar cells now on the market are made of silicon, but higher efficiency cells from other materials have been investigated in recent years. Particular interest has been focused on gallium arsenide and related alloys and, more recently, on indium phosphide and related alloys. One of the important properties of indium phosphide is its resistance to radiation damage. This property is particularly advantageous in solar cells for space application, but it leads to long-lived and efficient cells for terrestrial applications as well.

Means of concentrating solar energy onto solar cells for terrestrial applications are also being developed. Intensities of hundreds or even thousands of times that of the sun are considered feasible to apply to solar cells if heat dissipation is adequate and cells can be developed which are long-lived at such conditions.

Significant increases in solar cell efficiency are possible from the use of tandem subcells of different materials, the different materials having different energy bandgaps between their valence electron bands and their conduction bands. A tandem cell is described in U.S. Pat. No. 5,019,177, which is incorporated herein by reference. One of the subcells disclosed in this patent is comprised of indium phosphide. The growth of tandem cells by epitaxial methods in which the subcells are lattice-matched offers the possibility of monolithic structures having minimal defects or dislocations in the crystal lattice which lower the efficiency of the device. Tandem cells having indium phosphide as one of the subcells are particularly attractive, because there are a variety of III-V ternary and quaternary alloys available having differing energy bandgaps which are lattice-matched with indium phosphide. The integrated InP/InGaAs tandem solar cell has a theoretical efficiency greater than 30 per cent. Integrated cells having three or more subcells can also be considered, the top subcell having the highest energy bandgap, so as to absorb and convert the shortest wavelength light to electrical energy and allow the longer wavelength light to pass through, and the lowest subcell having the lowest energy bandgap to absorb the longer wavelength optical energy.

Lattice constants of compounds and alloys used to form photovoltaic cells are well-known. When such materials are combined in devices having subcells of the different materials, it is important that the lattice of the different materials have the same lattice constants to within a small difference. This avoids the formation of defects in the crystal structures which can drastically lower the efficiency of the devices. When the term lattice-matched is used herein, it denotes a difference in lattice constants of the materials of not more than about 0.3 per cent. Preferably, lattice constants are matched to within about 0.2 per cent.

In any tandem cell device having only two contacts, electrical connection must be made between the subcells. Preferably, these intercell ohmic contacts (IOCs) should cause very low loss of electrical power between cells. Therefore, they must have minimal electrical resistance. There are two methods known for making such IOCs—metal interconnects and tunnel junctions (or tunnel diodes). The metal interconnects can provide low electrical resistance, but they are difficult to fabricate, they result in complex processing, and can cause substantial loss in the device efficiency. Therefore, tunnel junctions are much preferred, because a monolithic integrated device can be produced having a plurality of subcells with tunnel junctions therebetween. But, the tunnel junctions must satisfy multiple requirements, such as low resistivity, low optical losses, and crystallographic compatibility through lattice-matching between top and bottom cell. Most importantly, they should exhibit a high peak current density. All these characteristics should be conserved upon completion of the entire monolithic device.

The use of $In_{0.53}Ga_{0.47}As$ tunnel diodes for interconnecting tandem subcells of a solar cell has been proposed ("An $In_{0.53}Ga_{0.47}As$ Tunnel Diode for Monolithic Multi-junction Solar Cell Applications," Proc. 20th IEEE Photovoltaic Specialist Conference, IEEE, New York, 1988, pp. 771–776). It was suggested that this material offered the possibility of low electrical resistance tunnel diodes, but optical loss could be substantial. Of course, tunnel diodes between subcells should absorb minimal amounts of the incoming optical energy, which allows the maximum amount of solar energy to be converted to electrical energy. It was further suggested that any tunnel junctions of this material be made very thin or be patterned, so as to minimize loss of solar energy in passing between subcells. The use of patterns, which decreases the area available for the tunnel junction, increases the need for a tunnel junction having low resistance and much higher peak current density.

Solar cells having indium phosphide as one of the subcells and indium gallium arsenide phosphide as a second subcell have been described ("Two-Terminal Monolithic InP/InGaAsP Tandem Solar Cells with Tunneling Intercell Ohmic Connections," Proc 22nd. IEEE Photovoltaic Specialists Conference, IEEE, New York, 1991, pp. 381–387). These cells were grown by the process of liquid phase epitaxy (LPE). It was found that, although $In_{0.53}Ga_{0.47}As$ tunnel junctions could offer high peak current densities and low electrical resistance, such tunnel junctions could not be incorporated into tandem solar cells structures because meltback problems during the LPE growth would not allow InP to be grown on the $In_{0.53}Ga_{0.47}As$ tunnel junction. The tunnel junction to connect these subcells which could be grown by LPE, consisting of InGaAsP, had peak current and resistivity values far less favorable than attained with $In_{0.53}Ga_{0.47}As$ tunnel junctions grown on an InP substrate.

There is great need for a tandem solar cell having indium phosphide or an indium phosphide alloy in the indium phosphide system as a subcell, another subcell which is lattice-matched to the indium phosphide and having an energy bandgap differing from that of indium phosphide, and a lattice-matched tunnel junction to interconnect the subcells. The tunnel junction should exhibit high peak current and low resistivity values so as to allow maximum efficiency of the tandem solar cell. There is also a need for a method to fabricate such a tandem solar cell as a monolithic device under conditions which will form and leave intact the tunnel junction when a subcell is grown on top of the tunnel junction.

SUMMARY OF THE INVENTION

A tandem solar cell having indium phosphide as a subcell and lattice-matched indium gallium arsenide as a subcell and having a lattice-matched tunnel junction comprising indium gallium arsenide is provided. In one embodiment, the tunnel junction is patterned so as to allow maximum transmittance of light to the material below the tunnel junction.

A tunnel junction is provided having effective dopant concentrations, as defined herein, of at least about $10^{18}$ cm$^{-3}$.

A method of growing a subcell which is lattice-matched with indium phosphide on a tunnel junction is provided, the growth temperature being between about 300° and 550° C.

A method of growing an indium gallium arsenide tunnel junction at a temperature in the range from about 300° C. and 550° C. is provided.

A method of preparing an indium phosphide single solar cell or an indium gallium arsenide single solar cell using chemical beam epitaxy is provided.

DETAILED DESCRIPTION OF PREFERRED EMBODIMENT

Figure 1:
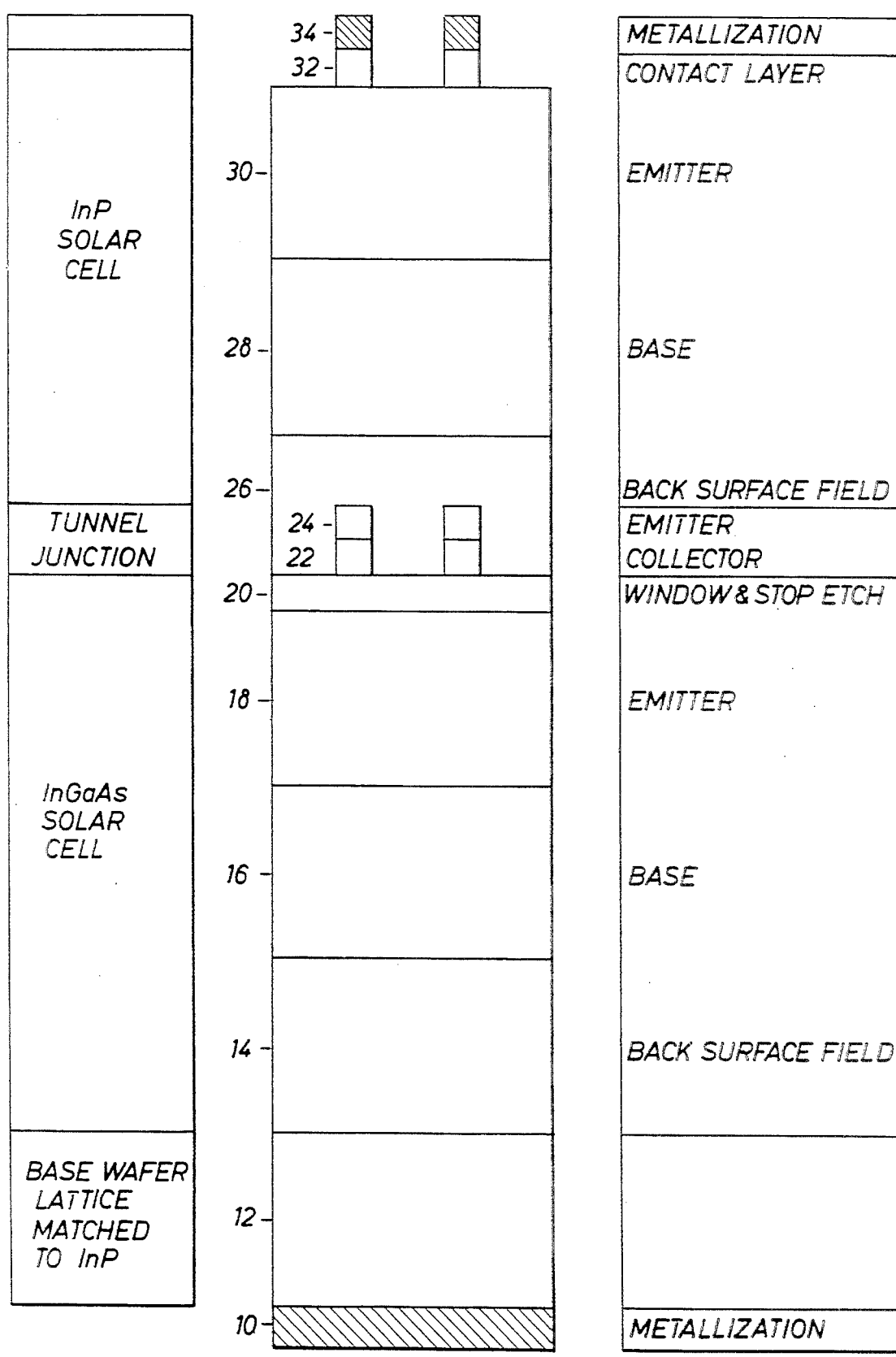
FIG. 1 is a sketch of a tandem solar cell of this invention.

A solar cell fabricated according to this invention is illustrated in FIG. 1. The solar cell is fabricated on substrate 12, the top layer of which is lattice-matched to indium phosphide and bottom surface of which is back contact 10. Other suitable materials well-known in the art may be used as a substrate with buffer layers to accommodate crystal lattice matching requirements between the sub-layer and the top layer of the substrate. A subcell of indium gallium arsenide, consisting of back surface field 14, base 16, and emitter 18, is then provided. Other alloys may be used if lattice-matched with indium phosphide. The subcell is grown by any known technique, such as liquid phase epitaxy (LPE), metal-organic chemical vapor deposition (MOCVD), chemical beam epitaxy (CBE), or other method for growing such material. CBE is a low-pressure (pressure less than 0.01 torr) growth technique using all gas or a combination of gas or solid source precursors. The gases can be either organometallics or hydrides of the elements of the desired alloys and dopants. Solid sources can be metals or metalloids of the desired alloys and dopants.

In one embodiment of this invention, where a p- on n-type solar cell is realized, a layer of p-InP is grown as an etch stop layer 20 above the lower subcell; an n-InP layer is grown when an n- on p-type solar cell is used for the first subcell. If the device to this stage has been grown in a separate apparatus, it is then transferred to a chamber suitable for low-temperature epitaxial growth, such as by chemical beam epitaxy (CBE).

Figure 2:
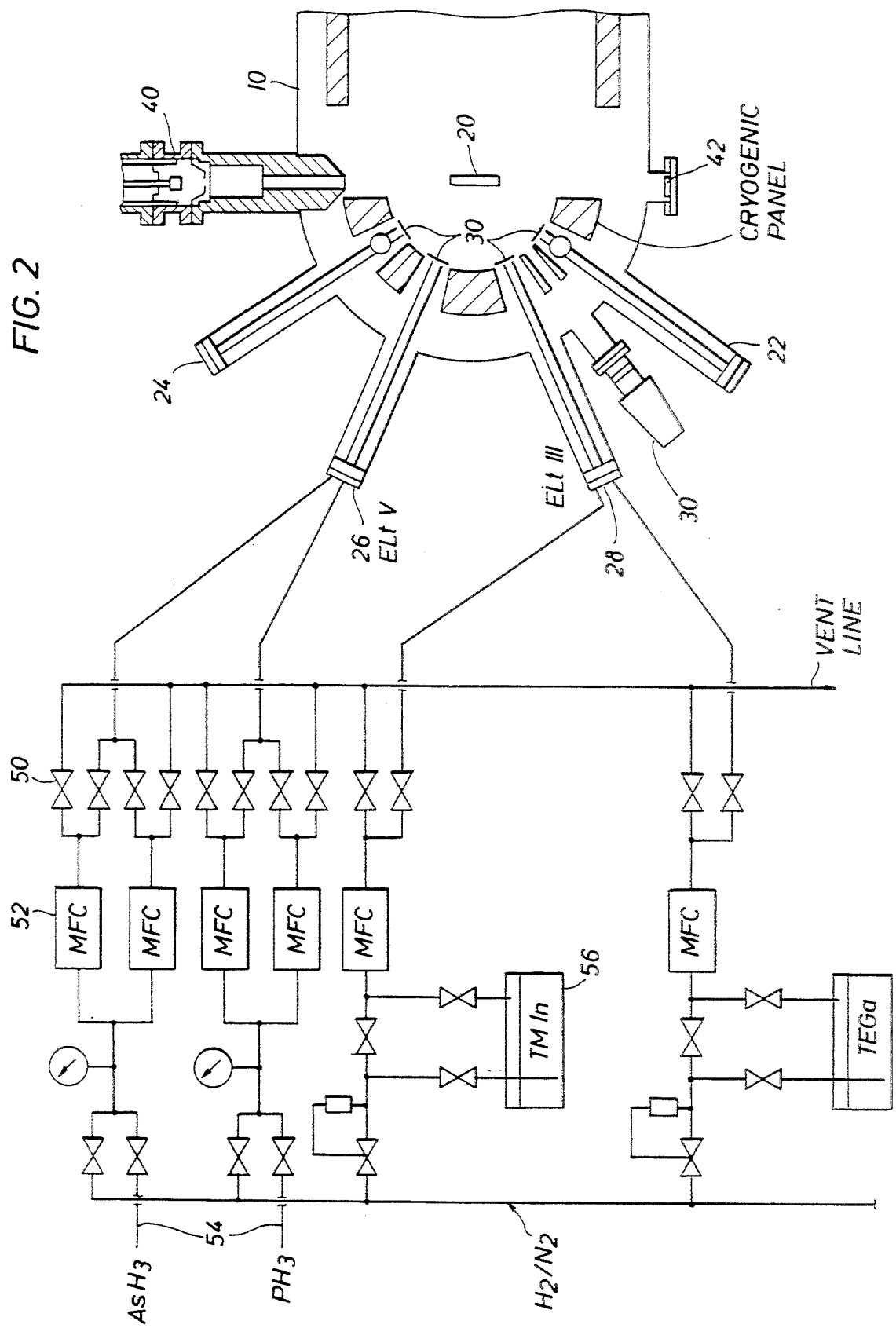
FIG. 2 is a drawing of apparatus suitable for use in the methods of this invention.

Apparatus suitable for use in the method of this invention is shown in FIG. 2. Chamber 10 is designed to provide a vacuum environment. Substrate 20 is disposed in the chamber so as to be available for epitaxial growth from precursor materials provided from solid source containers 22 and 24, from a high temperature channel 26 through which hydride or other gases may enter the chamber, and from a low-temperature channel 28 through which organo-metallic compounds enter the chamber. Pyrometer 30 is placed so as to measure the temperature of the surface of the epitaxial growth. Scanning electron gun 40 and fluorescent screen 42 are used to monitor crystal lattice-matching. Gases are provided to the chamber 10 from sources 54 through mass flow controllers 52 and valves 50. Organo-metallic compounds containing precursor elements are added in bubblers 56 and carried to chamber 10 in hydrogen gas.

Referring again to FIG. 1, epitaxial growth of the tunnel junction consisting of collector layer 22 and emitter layer 24 is accomplished at temperatures below 550° C. Metal-organic compounds such as trimethyl-indium (TMI), triethyl-indium (TEI), and triethylgallium (TEG) are used to provide indium and gallium at the required temperatures. Pre-cracked arsine (AsH$_3$) and phosphine (PH$_3$) are also employed in the proper proportions as growth precursors. Due to strong dependence of the InGaAs alloy composition on temperature, lattice-matching with respect to InP may be analyzed as the tunnel junction is grown. The tunnel junction is preferably grown at substrate surface temperatures in the range from about 300° to 550° C. More preferably, the temperature range is from about 460° C. to about 550° C. Most preferably, the temperature range is from about 480° C. to about 530° C. Surface temperature is preferably measured by pyrometry, but any accurate method is acceptable. Care must be taken to avoid erroneous measurements from temperature sensors which are not located at the surface of the substrate. The tunnel junction is preferably grown at a growth rate in the range from about 0.1 to 10 microns per hour; more preferably the growth rate is in the range from about 0.1 to about 2 microns per hour; most preferably the growth rate is in the range from about 0.5 and 1.5 microns per hour. These growth rates are also applicable to all the subcells in the tandem device. Lattice matching may be checked by double crystal X-ray diffraction. Desirable pressure range in the chamber depends on precursor compounds used and other factors, but is preferably in the range from about $10^{-7}$ torr to about $10^{-2}$ torr. More preferable, the pressure in the chamber should be between $10^{-5}$ and $5 \times 10^{-4}$ torr. The pressure measured in the chamber must be representative of the pressure at the substrate location.

After the desired pattern of the tunnel junction is achieved by techniques well-known to those skilled in the art, the top subcell, consisting of back surface field 26, base 28, and emitter 30 are epitaxially grown. This subcell is grown by the methods of this invention at a temperature below 550° C., so as to leave intact the tunnel junction that has been grown. The lower subcell and the tunnel junction may be grown by the methods of this invention or by a method employing temperatures higher than 550° C., but the upper subcell must be epitaxially grown in the temperature range of this invention. Contact layer 32 and front contact 34 are then applied using well-known methods. An anti-reflection coating (not shown) is usually applied over the top of the device.

Although indium phosphide is shown in FIG. 1, it should be clear that alloys in the indium phosphide system that are lattice-matched to indium phosphide may also be used. The following alloys are here considered alloys in the indium phosphide system: AlInAs, GaAsSb, InAsP, AlPSb, GaPSb, GaInAs, GaInAsP, GaInAsSb, AlInAsSb, GaInPSb, AlInPSb, and AlGaPSb. These alloys have somewhat different energy bandgaps, which may be desirable in some applications, and may be used as subcells.

Similarly, indium gallium arsenide is used herein to include all alloys of indium gallium arsenide with the addition of isovalent elements such as phosphorous, aluminum, and tin in concentrations such that the modifications to the bandgap are less than 0.1 eV compared to $In_{0.53}Ga_{0.47}As$ (E=0.72 eV) and a change in lattice constant such that the lattice mismatch is less than 0.03 per cent.

The tunnel junction may be prepared by doping with a variety of elements, such as n-type doping with sulfur, tellurium, selenium, germanium, tin, or silicon and p-type doping with carbon, zinc, cadmium, beryllium, or magnesium. Dopant concentrations are realized by controlling the temperature of solid source effusion cells or controlling flowrate with flowmeters when organometallic or hydride sources are used as dopant.

Figure 3A:
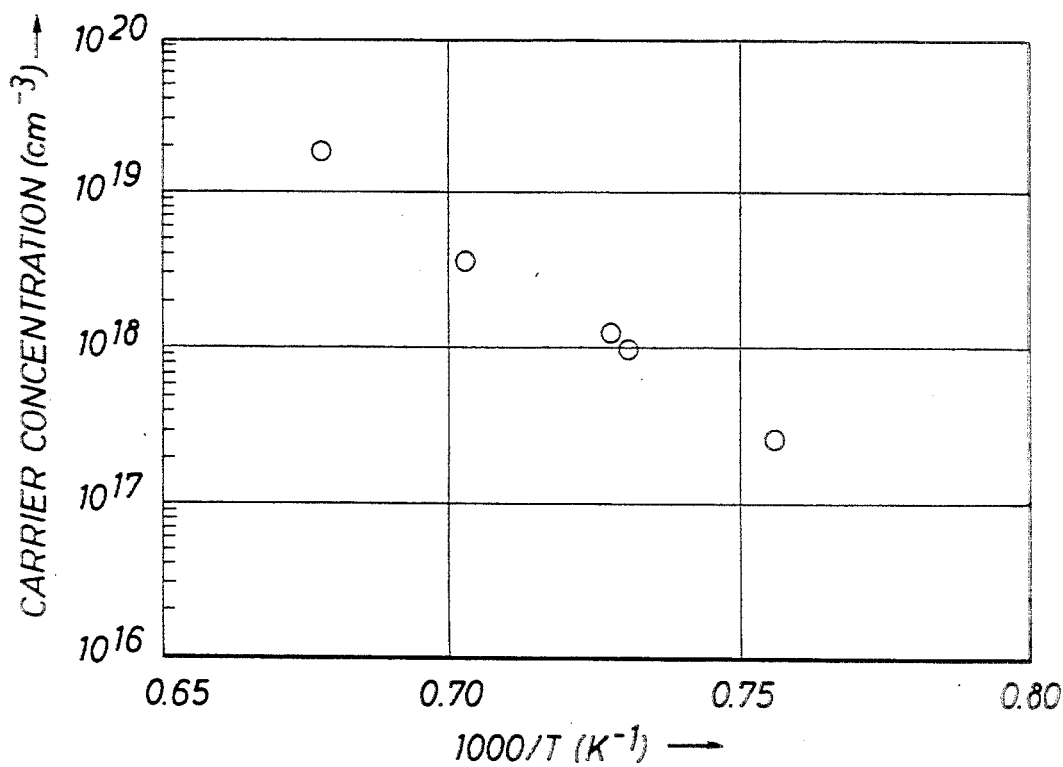
FIGS. 3(a) and (b) are graphs of concentrations of dopants produced at differing temperatures by the method of this invention.
Figure 3B:
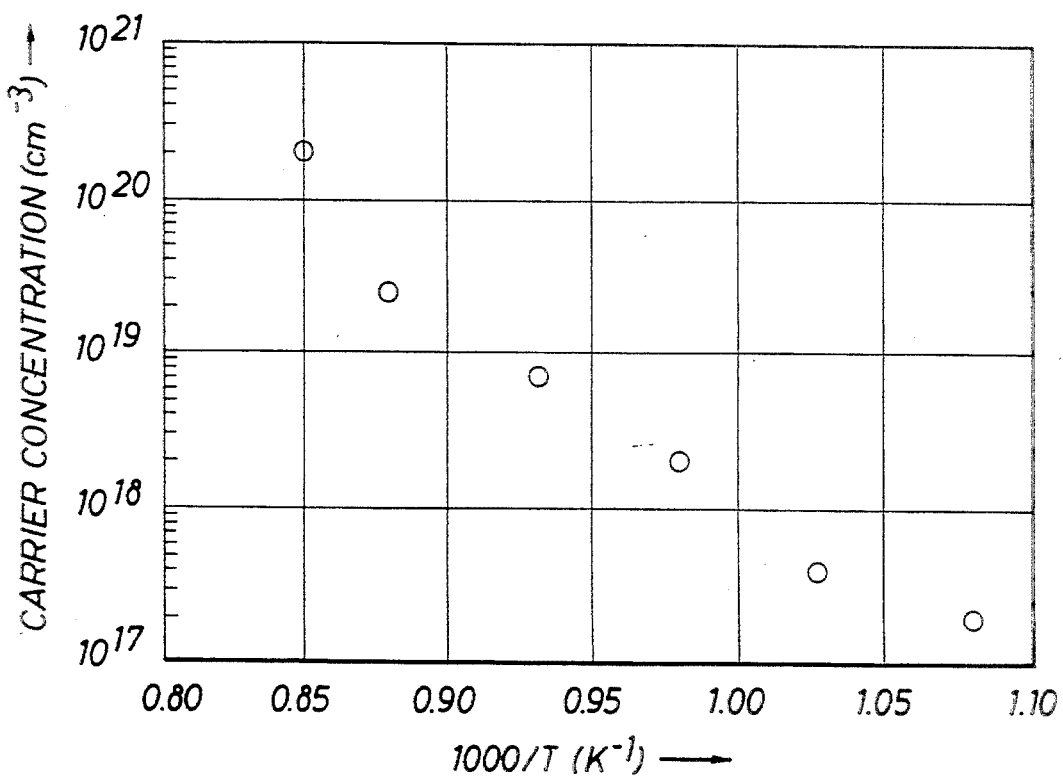

Beryllium and silicon doping was investigated using lattice-matched conditions. Results are shown in FIGS. 3(a) and 3(b). Beryllium doped p-GaInAs with net hole concentrations from $2 \times 10^{17}$ cm$^{-3}$ to $2 \times 10^{20}$ cm$^{-3}$ were achieved, as determined from Hall effect measurements. By measuring beryllium concentration as a function of temperature of growth, the activation energy of beryllium incorporation was measured to be 3.4 eV for a growth rate around 1 micron per hour (FIG. 3(b)). Even at doping levels as high as $2 \times 10^{\circ}$cm$^{-3}$, no surface degradation was observed.

Silicon doping was also investigated within a doping range of $10^{17}$ cm$^{-3}$ to $2 \times 10^{19}$ cm$^{-3}$. An activation energy of 6.2 eV was determined (FIG. 3(a)). No noticeable electrical compensation was detected and good reproducibility was achieved from run to run. Similar approaches were used to establish the temperatures of Be and Si cells to achieve p- and n-doping of the indium phosphide layers.

Figure 4:
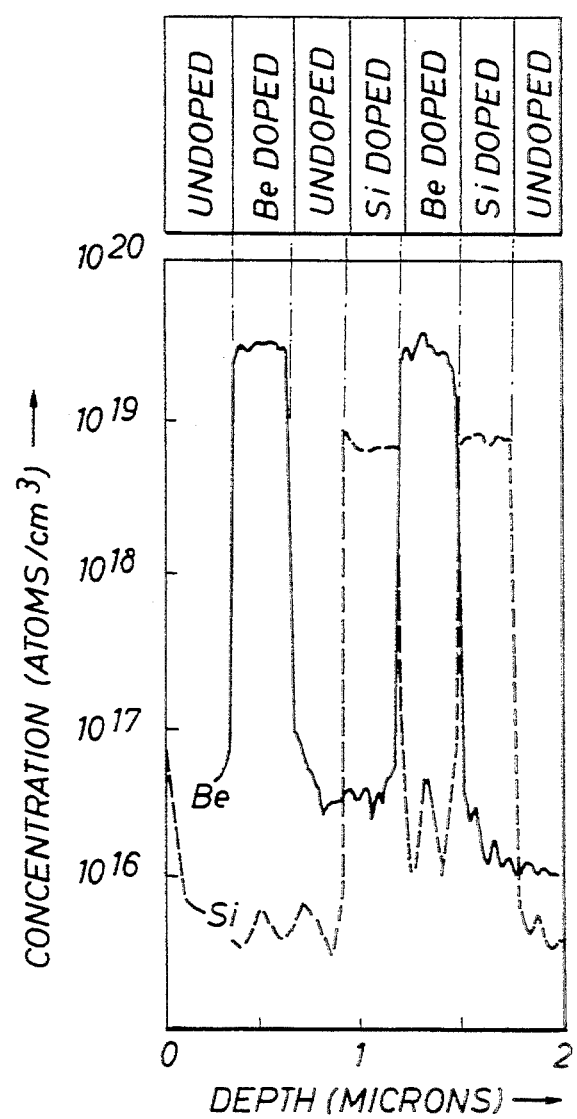
FIG. 4 is the SIMS profile data showing lack of interdiffusion of dopants produced by the method of this invention.

In order to investigate the cross-diffusion behavior of the doped materials, Secondary Ion Mass Spectroscopy (SIMS) was carried out on InGaAs multilayered structures fabricated with a combination of different beryllium and silicon doping levels and undoped spacers. FIG. 4 shows results of such experiments. A Cameca IMS 4F system was used and 0+ and Cs− profiles were taken for beryllium and silicon, respectively. It can be observed from FIG. 4 that the memory effects are in the range of $10^{16}$ cm$^{-3}$ for both silicon and beryllium. Further, at the interface between beryllium and silicon doped layers, observed cross-diffusions are within experimental error. The sharp diffusion profiles between beryllium and silicon are consistent with the requirements of tunnel junctions to have low inter-diffusion. As a result of the low inter-diffusion, which is made possible by the relatively low temperatures of growth, very thin tunnel junctions can be prepared with high concentrations of dopants.

To demonstrate such tunnel junctions, p+GaInAs/n+GaInAs tunnel junctions with different active layer thicknesses from 0.1 to 1 micron and doping concentrations of silicon in the range of $10^{18}$ cm$^{-3}$ to $2 \times 10^{19}$ cm$^{-3}$ and of beryllium in the range of $5 \times 10^{18}$ cm$^{-3}$ to $5 \times 10^{19}$ cm$^{-3}$ were prepared on indium phosphide substrates. Similar doping levels can be used for n+ on p+ tunnel junctions. For quantitative evaluation of tunnel junctions, devices were processed in the standard wet etching process with mesa openings of 100 and 200 microns in diameter. Gold was used for back and front ohmic contacts.

Figure 6:
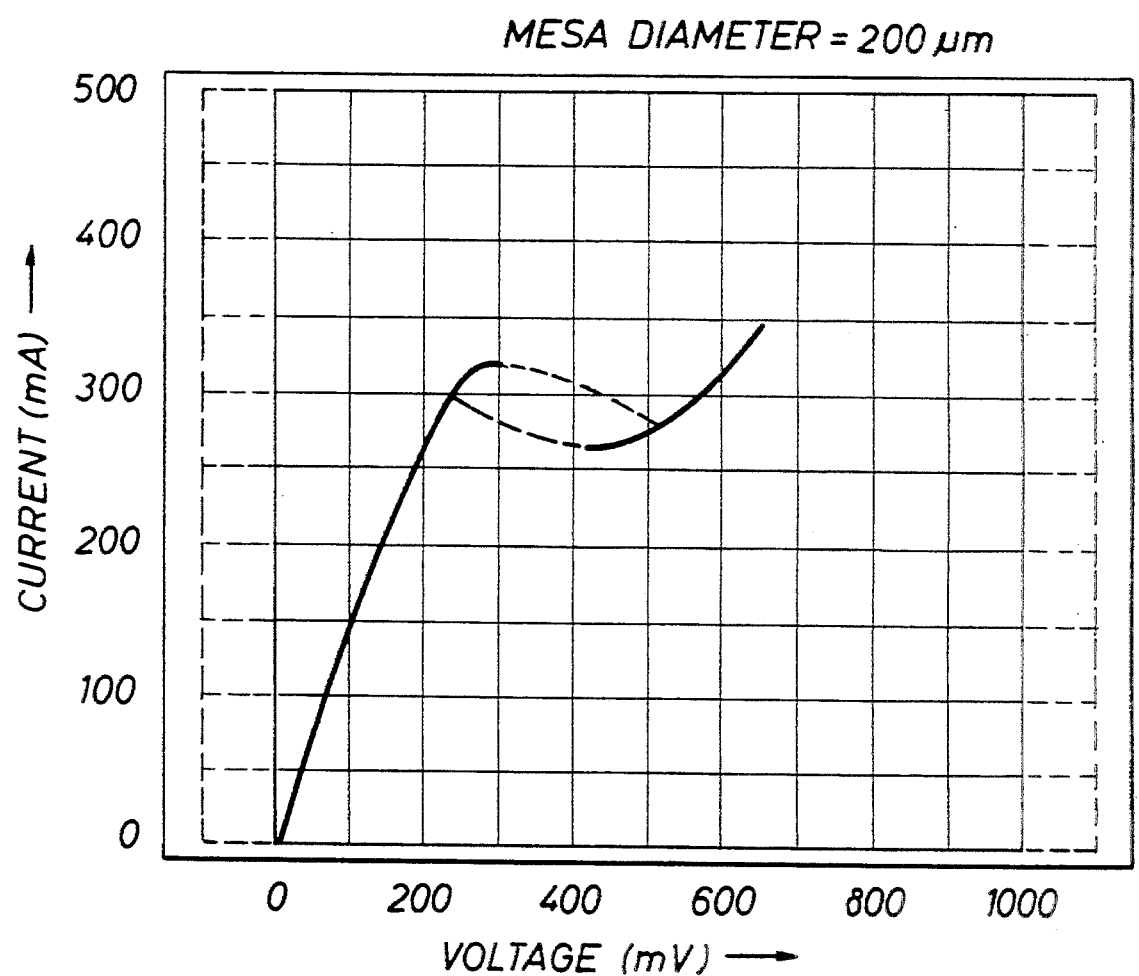
FIG. 6 is a graph of current vs. voltage for a tunnel junction of this invention.

It is well established that peak current, $J_p$, of a tunnel junction is given by $$J_p/V_p = 1/W \{A\ Eg^{\frac{1}{2}} \exp(-B\ Eg^{\frac{1}{2}} W)\} \qquad \text{Eq.(1)}$$

where, $$A = e^2(2m^*)^{\frac{1}{2}}/4h^2, \text{ and} \qquad \text{Eq.(2)}$$

$$B = \pi^2(2m^*)^{178}/2h, \text{ and} \qquad \text{Eq.(3)}$$

where e is the electron charge, m* is the reduced effective mass, Eg the band gap energy, W the space charge region width and Vp is the peak voltage of the tunnel junction. To a first order approximation Vp is given by (9)

$$V_p = kT/3e$$
$$\{ln(N_A N_D/N_c N_v) + 0.35[(N_A/N_v) + (N_D/N_c)]\} \qquad \text{Eq.(4)}$$

where $N_A$ and $N_D$ are p- and n-dopant concentrations and $N_v$ and $N_c$ are the intrinsic carrier concentrations in the valence and conduction bands, respectively. Therefore, from Equation (1), $J_p$ increases as the depleted region, W, becomes smaller. By the methods of this invention, very large values of $J_p$ can be obtained, as illustrated in FIG. 6. Very sharp concentration profiles are demonstrated in FIG. 4. The sharp concentration profiles are believed to be made possible by the relatively low temperature of growth of the tunnel junction.

Figure 5:
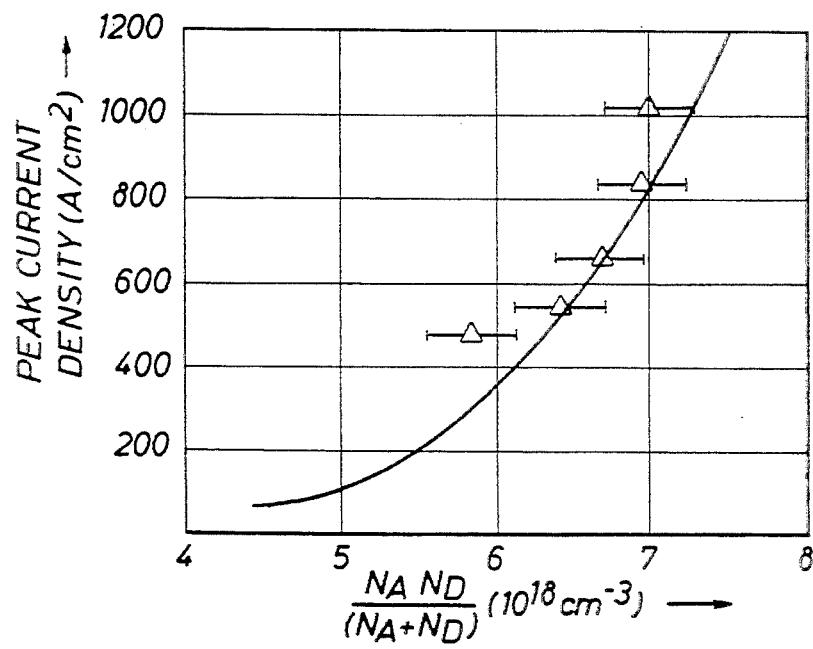
FIG. 5 is a graph of peak current densities vs. effective doping according to the method of this invention.

By the methods of this invention, large values of $J_p$ were obtained, from the fact that high dopant concentrations were achieved. The effective doping is defined as $N^* = N_A N_D/(N_A + N_D)$, where $N_A$ and $N_D$ are the p and n doping concentrations, respectively. FIG. 5 represents the expected peak current densities versus the effective doping of the device N*. Points on the curve and bars of uncertainty through these points indicate measured characteristics of tunnel junctions grown or fabricated using the methods of this invention. Good agreement between theory and experimental data are shown. Several tunnel junctions were grown having current densities greater than about 50 amperes per $cm^2$. Other tunnel junctions were grown having current densities greater than about 200 amperes per $cm^2$. The maximum current density measured was 1015 amperes per $cm^2$, but values even greater than this are believed possible by methods of this invention. Current densities were controlled by using differing values of effective dopant concentrations. These tunnel junctions were grown in the temperature range from 480° C. to 530° C., which is the most preferable temperature range. Such tunnel junctions can be grown at lower temperatures and higher temperatures. Preferably, the temperature range is from about 460 to about 530° C., but the temperature can be as low as about 300° C. and as high as about 550° C. During the growth, the pressure in the chamber was in the range of $10^{-5}$ to $10^{-4}$ torr, which is the most preferable range. Preferably, the pressure is in the range from about $10^{-6}$ torr to about $5\times10^{-4}$ torr, but the pressure can be as low as about 10-7 torr and as high as about 10-2 torr.

An indium gallium arsenide tunnel junction grown on indium phosphide produced I-V characteristics shown in FIG. 6. The tunnel junction had a composition selected to be lattice-matched with indium phosphide. Specifically, the composition was $In_{0.53}Ga_{0.47}As$. The peak current indicated by this curve was 1015 amperes-$cm^{-2}$. Such tunnel junction, being lattice-matched with indium phosphide, is ideally suited for use in solar cells. This peak current is larger than the prior values available for tunnel junctions with indium phosphide.

Resistivity of the tunnel junction described above was below $2\times10^{-4}$ ohm-cm-2. This value is based on peak current density and voltage. Resistivity is likely to be lower than this value in the operating range of current density and voltage between the subcells of a photovoltaic device.

Tunnel junctions were grown using doped $In_{0.53}Ga_{0.47}As$ having n-type dopant concentrations in the range from $2\times10^{18}$ $cm^{-3}$ to $5\times10^{19}$ $cm^{-3}$ and p-type doping concentrations from $2\times10^{18}$ to $2\times10^{20}$ $cm^{-3}$. These samples were grown at temperatures from 480° C. to 530° C. and grown to a thickness greater than 0.25 microns with growth rates of 0.5 to 2 microns per hour. There was no practical limit to lower growth rates. From results shown in FIG. 4, however, it is clear that thickness can be decreased to values as small as 0.1 microns, for example, or even to thicknesses less than a few hundred angstroms. This can be achieved by control of time for growth of the tunnel junction. The small thickness of the tunnel junction which may be grown by the method of this invention is such that absorption of optical energy is decreased. Optical energy absorption of indium gallium arsenide is such that about 80 per cent of the energy is absorbed in a thickness of about 3000 angstroms. With such absorbance, it is obvious that very small thicknesses are necessary to prevent complete absorption of light for wavelengths shorter than 1.5 micrometers in the area where the tunnel junction exists. (For longer wavelengths the InGaAs junction is totally transparent.)

Light absorption through tandem solar cells can be diminished by patterning of the tunnel junction, as shown in FIG. 1. The front contact is patterned to allow light to pass through the device. Area of the pattern is often in the range of 5 per cent of total area of the cell. The tunnel junction of this invention may be patterned to match that of the front contact. The pattern is produced in the method of fabrication of the tandem device by growing a stop-etch layer over the lower subcell. The tunnel junction is then grown on the stop-etch layer. A resist is then applied in the pattern desired, using well-known techniques, and the tunnel material is etched. A solution of sulfuric acid, hydrogen peroxide and water in volume proportions of 5/1/1 may be used at room temperature as an etchant. A back surface field and the top subcell is then epitaxially formed, using the low-temperature techniques disclosed in this invention.

The lowest value of temperature which is suitable for growth of such devices is determined by growth kinetics and crystal quality. It is believed that a practical lower limit of temperature is about 300° C. The upper temperature limit for growth of the top cell of this invention is controlled by interdiffusion of the doping species across the tunnel junction active region and the deterioration of the junction characteristics. The upper temperature limit is believed to be about 550° C.

A tunnel junction may be grown on a subcell at a temperature higher than the temperature range suitable for practice of this invention. To avoid destroying the properties of the tunnel junction, the method of this invention is then employed for growing the top cell.

Single solar cells of indium phosphide were grown using the method of this invention. A back surface field having a thickness of about 1 micron was grown. Silicon dopant concentration was at least about $2\times10^{18}$ $cm^{-3}$. Growth temperatures were in the range from about 490° to about 550° C. A base layer having thickness in the range from about 1 to 5 microns was then grown. Silicon dopant concentrations were in the range of 0.4 to $5\times10^{17}$. Growth temperatures were in the range from 490° to 550° C. An emitter layer having thickness in the range from about 0.1 to 0.6 microns was then grown. Beryllium concentrations were in the range of 1 to $5\times10^{18}$ $cm^{-3}$. Growth temperatures were in the range from 490° to 550° C. A contact layer was then grown. The contact layer thickness was from 0.1 to 0.5 microns. Beryllium concentrations were greater than $10^{18}$ per $cm^{-3}$. Growth temperature were in the range of 460° to 530° C. A metalization layer was then added using standard techniques.

Single solar cells of indium gallium arsenide were also fabricated using the methods of this invention. A back surface field layer was grown having thickness greater than 0.1 microns, and usually significantly thicker. Silicon dopant concentrations were greater than $10^{18}$ $cm^{-3}$. Temperatures were in the range from 500° to 530° C. A base layer was then grown to a thickness from 2 to 4 microns. Silicon dopant concentrations were from 0.8 to $2\times10^{17}$ $cm^{-3}$. Temperatures were in the range from 460° to 530° C. An emitter layer was then grown to thickness in the range from 0.3 to 0.5 micron. Beryllium concentrations were from 1 to $3\times10^{18}$ $cm^{-3}$. Temperatures were in the range from 500° to 530° C. A window of indium phosphide was then grown to a thickness of 0.03 to 0.05 microns using the same range of concentrations of beryllium and of temperature.

It should be understood that n- and p-type layers described in this invention are reversible, i.e., the sequence can begin with either type and a change to the other type can occur at a homojunction or interface between layers.

EXAMPLE 1

Figure 7A:
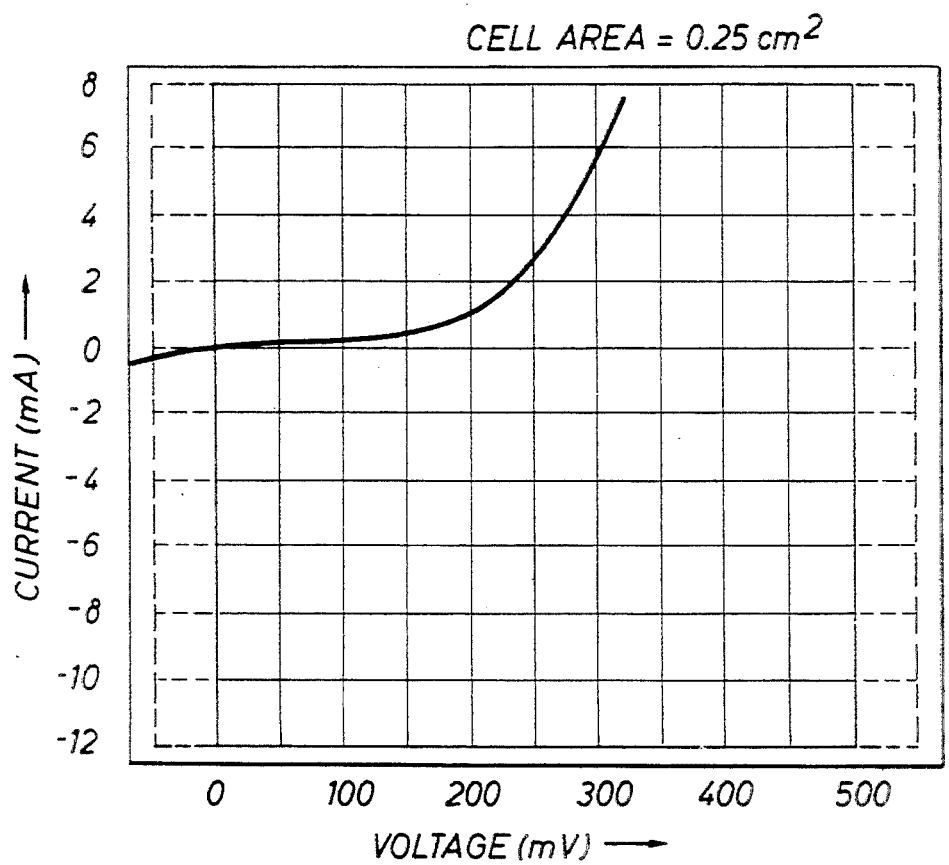
FIG. 7 describes dark (7(a)) and illuminated I-V (7(b)) characteristics of an indium gallium arsenide solar cell fabricated using the method of this invention.
Figure 7B:
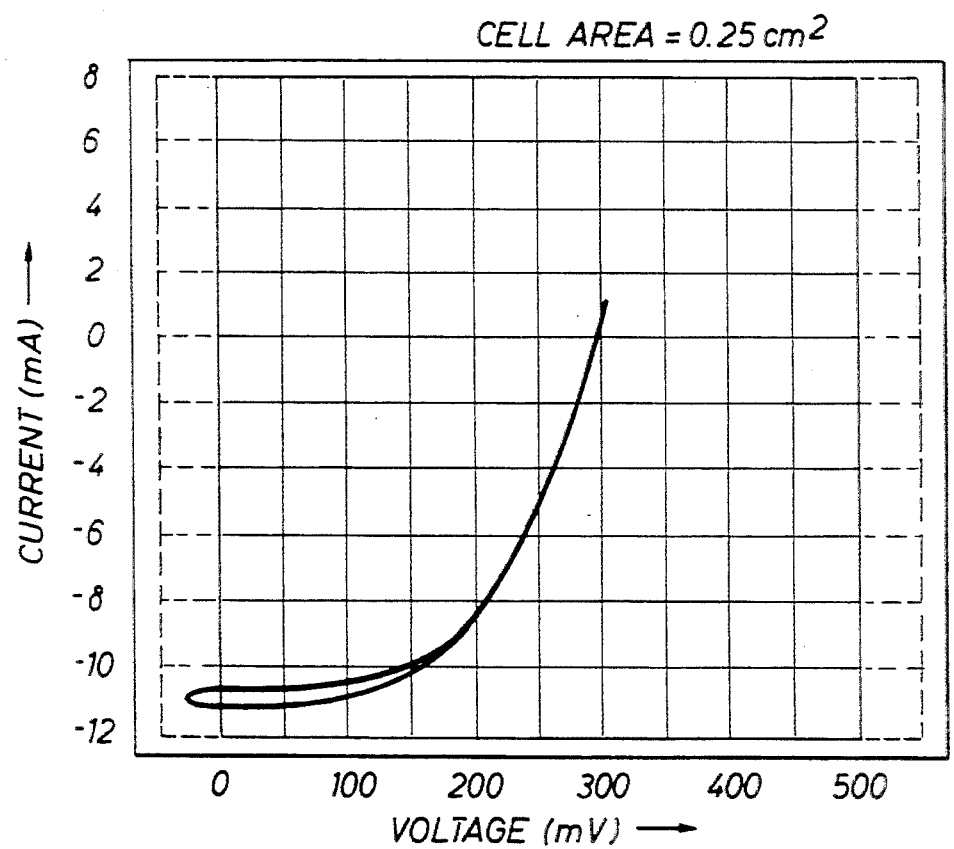

An indium gallium arsenide solar cell was fabricated on a suitable substrate by chemical beam epitaxy and the methods of this invention and the I–V characteristics of the cell were measured. Results are shown in FIG. 7. From the dark (FIG. 7(a)) and illuminated (FIG. 7(b)) characteristics at AM 1.0 simulated (100 milliwatt per cm$^2$), an efficiency of 7.0 per cent was calculated for the 0.25 cm$^2$ device, using techniques well-known in the art. Efficiency is expected to increase to about 9 per cent with an optimized anti-reflective coating.

EXAMPLE 2

Figure 8A:
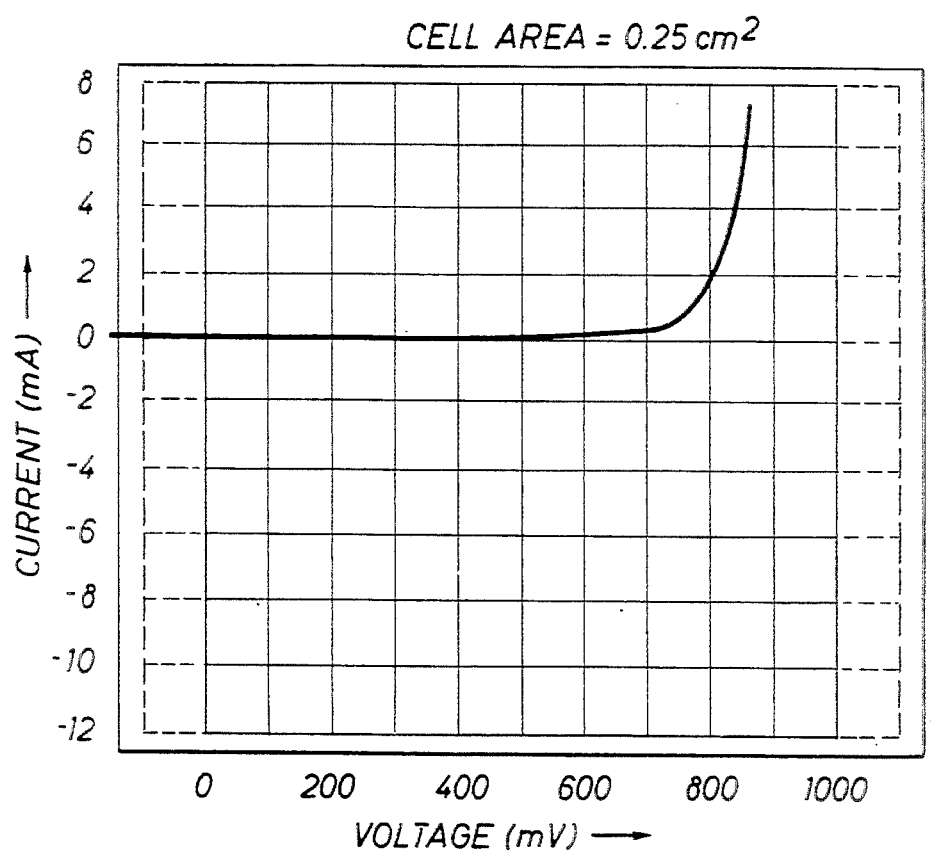
FIG. 8 describes dark (8(a)) and illuminated I-V (8(b)) characteristics of an indium phosphide solar cell fabricated using the method of this invention.
Figure 8B:
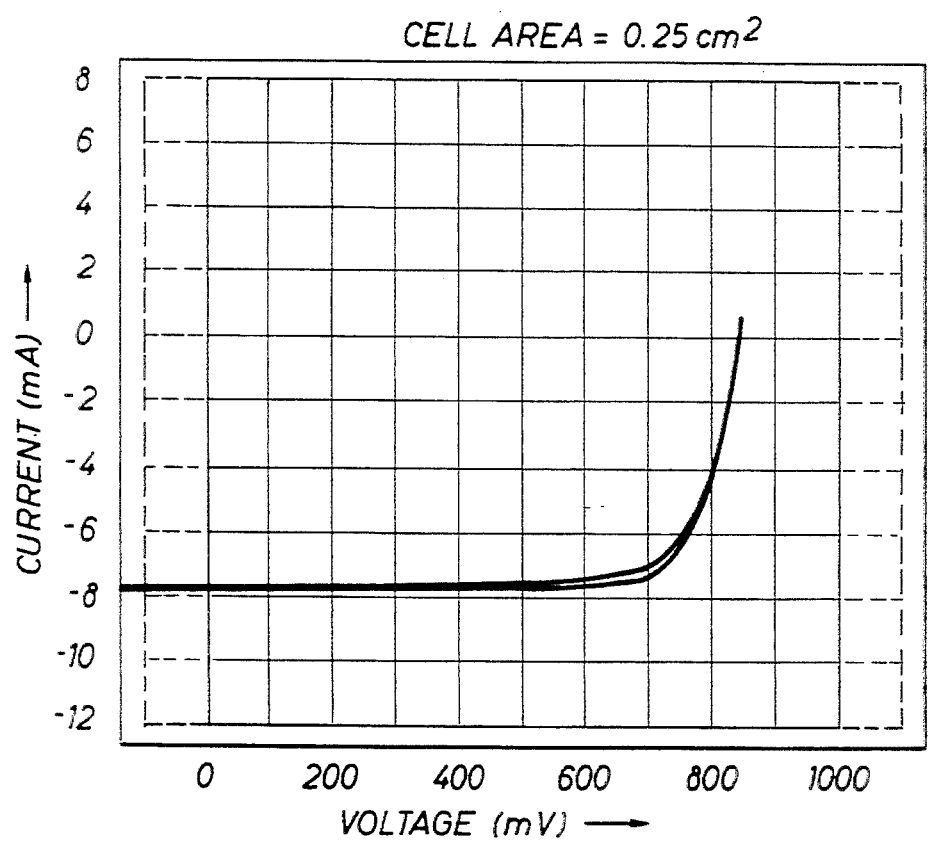

An indium phosphide solar cell was grown on a suitable substrate by chemical beam epitaxy using the methods of this invention and the I–V characteristics of the cell were measured. Results are shown in FIG. 8. From the dark (FIG. 8(a)) and illuminated (FIG. 8(b)) characteristics at AM 1.0 simulated (100 milliwatt per cm$^2$) illumination, an efficiency of 19.5 per cent was calculated for the 0.25 cm$^2$ device, using techniques well-known in the art. Efficiency is expected to increase to about 21 per cent with an optimized anti-reflective coating.

EXAMPLE 3

The cell of Example 1 is grown as a lower subcell after optimizing growth procedures. An indium phosphide etch-stop later is then grown on the subcell. An indium gallium arsenide tunnel junction, having an effective dopant concentration of $7 \times 10^{18}$ cm$^{-3}$ is grown in apparatus such as shown in FIG. 2 under preferred conditions set out herein. After usual etching and patterning procedures, an optimized indium phosphide cell is grown on the etched tunnel junction under preferred conditions set out herein. The usual contact layer and front contact are added having the same pattern as the tunnel junction. The substrate is provided with a suitable back contact. An anti-reflective coating is applied using well-known techniques.

The efficiency of the cell is measured to be 30 per cent at 1 sun and 33 per cent at 1000 suns intensity. The voltage drop due to the tunnel junction, which occupies only 5 per cent of the area of the device and has a peak current density of 1000 amperes cm$^{-2}$ and a resistivity of $2 \times 10^{-4}$ ohm·cm$^2$, is only 0.02 volt when the tandem device is producing a current of 30 amperes and 1.25 volts. The decrease in efficiency of the device from electrical loss in the tunnel junction is only 1.5 per cent, whereas with the prior art device, having a peak current of 28 amperes cm$^{-2}$, would not allow such high currents to pass the tunnel junction. The maximum allowed current of the tandem cell fabricated with the prior art tunnel device is 1.4 amperes cm$^{-2}$ with a voltage drop of 0.4 volt. The decrease in efficiency of such a tandem device fabricated with the prior art tunnel junction is expected to be more than 95 per cent of the sum of the efficiencies of the individual subcells.

EXAMPLE 4

An indium gallium arsenide tunnel junction was grown in a chamber such as shown in FIG. 2. The tunnel junction was doped with beryllium and silicon to an effective concentration of $7 \times 10^{18}$ cm$^{-3}$. Indium gallium arsenide was then grown on top of the tunnel junction, using chemical beam epitaxy. The growth was carried out for about 45 minutes at a temperature in the range of 480° C. to 530° C. and a pressure of $10^{-4}$ torr. After growth of the indium gallium arsenide, tests were performed to determine tunnel junction properties. The I–V curve, such as shown in FIG. 6, showed that properties of the tunnel junction were left intact by growth of the indium gallium arsenide on top of the tunnel junction at these growth conditions. Since indium phosphide can be grown on top of the tunnel junction at these same conditions, it is shown that a tunnel junction having these electrical properties can be produced between indium phosphide on top and a lattice-matched material under the tunnel junction. This step completes the requirements for fabrication of a tandem solar cell having indium phosphide as one of the subcells and being lattice matched with a subcell, the subcells being connected by the tunnel junction.

The invention has been described with reference to its preferred embodiments. Those of ordinary skill in the art may, upon reading this disclosure, appreciate changes or modifications which do not depart from the scope and spirit of the invention as described above or claimed hereafter.

What is claimed is:

1. A two-terminal, monolithic, tandem photovoltaic device comprising:
    a substrate having an upper and lower surface;
    a first photoactive subcell on the upper surface of the substrate, the first subcell comprising a semiconductor material lattice-matched to the top layer of the substrate and having an energy bandgap;
    a second photoactive subcell above the first subcell, the second subcell comprising a semiconductor material lattice-matched to the first subcell and having a different energy bandgap than the first subcell; and
    a tunnel junction, the tunnel junction comprising doped indium gallium arsenide, interconnecting the first and second subcells, the tunnel junction being lattice-matched to the first and second subcells and having a peak current density greater than 50 amperes cm$^{-2}$.

2. The device of claim 1 wherein the first subcell is comprised of indium gallium arsenide.

3. The device of claim 1 wherein the second subcell is comprised of indium phosphide.

4. The device of claim 1 wherein the tunnel junction is comprised of In$_{0.53}$Ga$_{0.47}$As.

5. The device of claim 4 wherein the dopants for said tunnel junction are selected from the group of n-type dopants consisting of sulfur, tellurium, selenium, germanium, tin, and silicon and the group of p-type dopants consisting of carbon, zinc, cadmium, beryllium, and magnesium.

6. The device of claim 4 wherein the dopants for said tunnel junction are silicon and beryllium.

7. The device of claim 4 wherein the peak current density of said tunnel junction is greater than 200 amperes cm$^{-2}$.

8. A method for preparing a two-terminal, monolithic, tandem photovoltaic cell, comprising the steps of:
    providing a substrate having a top layer lattice-matched with indium phosphide;
    providing on said substrate a subcell lattice-matched to the top layer of the substrate;
    epitaxially depositing on the first subcell a tunnel junction, the tunnel junction comprising doped indium gallium arsenide; and epitaxially depositing on the tunnel junction a second subcell comprising indium phosphide, the deposition of the second subcell being at a surface temperature in the range from about 300° C. to about 550° C.

9. The method of claim 8 wherein the surface temperature is in the range from about 460° C. to about 550° C.

10. The method of claim 8 wherein the surface temperature is in the range from about 480° C. to about 530° C.

11. The method of claim 8 wherein the first subcell is comprised of indium gallium arsenide.

12. The method of claim 8 wherein the second subcell is comprised of indium phosphide.

13. The method of claim 8 wherein the second cell is deposited using chemical beam epitaxy.

14. The method of claim 8 wherein the tunnel junction is deposited using chemical beam epitaxy.

15. The method of claim 8 wherein the first subcell is deposited using chemical beam epitaxy.

16. The method of claim 8 wherein the first subcell, the tunnel junction, and the second subcell are deposited using chemical beam epitaxy.

17. The method of claim 8 additionally comprising the steps of depositing a tunnel junction and a third subcell of top of the second subcell.

18. A method for preparing a two-terminal monolithic tandem photovoltaic cell having a patterned tunnel junction, comprising the steps of:
providing a substrate having a top layer lattice-matched with indium phosphide;
providing on said substrate a lower subcell lattice-matched to the top layer of the substrate, the lower subcell having an upper surface;
providing a stop-etch layer on the upper surface of the lower subcell;
epitaxially depositing on the stop-etch layer a tunnel junction;
patterning the tunnel junction; and
epitaxially depositing on the tunnel junction a second subcell comprising indium phosphide, the surface temperature of deposition of the second subcell being in the range from about 300° C. to about 550° C.

19. The method of claim 18 wherein the tunnel junction is comprised of indium gallium arsenide.

20. The method of claim 18 additionally comprising the steps of forming a tunnel junction and a third subcell on top of the second subcell.

21. An device including an indium gallium arsenide tunnel junction, comprising:
two subcells formed on opposite sides of the tunnel junction;
said tunnel junction comprising indium gallium arsenide;
an n-type dopant for said tunnel junction selected from the group of elements consisting of sulfur, tellurium, selenium, germanium, tin, and silicon and a p-type dopant for said tunnel junction selected from the group of elements consisting of carbon, zinc, cadmium, beryllium, and magnesium, the dopant concentrations being greater than $10^{18}$ atoms cm$^{-3}$.

22. The device of claim 21 wherein the proportion of indium, gallium, and arsenic atoms is selected to lattice-match the tunnel junction to indium phosphide.

23. The device of claim 21 wherein the peak current density of the tunnel junction is greater than 800 amperes per cm$^2$.

24. A method of forming a tandem photovoltaic device including a gallium indium arsenide tunnel junction, comprising:
providing a first subcell;
providing precursor elements of tunnel junction-forming materials;
growing the tunnel junction on the surface of said first subcell at a surface temperature in the range from about 300° C. to about 550° C. and a pressure in the range from about $10^{-7}$ torr to about $10^{-2}$ torr.

25. The method of claim 24 wherein at least one of the precursor elements is provided in an organometallic compound.

26. The method of claim 24 wherein the tunnel junction is allowed to grow at a surface temperature in the range from about 480° C. to about 530° C.

27. A method of fabricating a single solar cell comprising indium phosphide, the method comprising the steps of:
providing a substrate having a top layer lattice-matched with indium phosphide;
depositing by chemical beam epitaxy indium phosphide or an alloy in the indium phosphide system on the substrate, the deposition being at a surface temperature in the range from about 300° C. to about 550° C. and a pressure in the range from about $10^{-7}$ to about $10^{-2}$ torr.

28. A method of fabricating a single solar cell comprising indium gallium arsenide, the method comprising the steps of:
providing a substrate having a top layer lattice-matched with indium gallium arsenide;
depositing by chemical beam epitaxy indium gallium arsenide on the substrate, the deposition being at a surface temperature in the range from about 300° C. to about 550° C. and a pressure in the range from about $10^{-7}$ to about $10^{-2}$ torr.

* * * * *